US006711043B2

(12) United States Patent
Friedman et al.

(10) Patent No.: US 6,711,043 B2
(45) Date of Patent: *Mar. 23, 2004

(54) THREE-DIMENSIONAL MEMORY CACHE SYSTEM

(75) Inventors: David R. Friedman, Menlo Park, CA (US); J. James Tringali, Los Altos, CA (US); Roy E. Scheuerlein, Cupertino, CA (US); James E. Schneider, Palo Alto, CA (US); Christopher S. Moore, San Jose, CA (US); Daniel C. Steere, Menlo Park, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/186,356

(22) Filed: Jun. 27, 2002

(65) Prior Publication Data

US 2002/0167829 A1 Nov. 14, 2002

Related U.S. Application Data

(63) Continuation-in-part of application No. 09/638,334, filed on Aug. 14, 2000, now Pat. No. 6,545,891.
(60) Provisional application No. 60/308,330, filed on Jul. 26, 2001.

(51) Int. Cl.[7] .................................................. G11C 5/02
(52) U.S. Cl. .............................. 365/51; 365/52; 365/63
(58) Field of Search .............................. 365/51, 52, 63, 365/130, 185.04, 104, 94; 361/735, 803

(56) References Cited

U.S. PATENT DOCUMENTS

| 4,272,880 A | 6/1981 | Pashley |
| 4,442,507 A | 4/1984 | Roesner |
| 4,489,478 A | 12/1984 | Sakurai |
| 4,498,226 A | 2/1985 | Inoue et al. |
| 4,499,557 A | 2/1985 | Holmberg et al. |
| 4,646,266 A | 2/1987 | Ovshinsky et al. |
| 4,677,742 A | 7/1987 | Johnson |
| 5,029,125 A | 7/1991 | Sciupac |
| 5,070,384 A | 12/1991 | McCollum et al. |
| 5,249,282 A | 9/1993 | Segers |

(List continued on next page.)

FOREIGN PATENT DOCUMENTS

WO    WO 99/14763    3/1999

OTHER PUBLICATIONS

Zhang, Ph.D., Guobiao, "*Three–Dimensional Read–Only Memory (3D–ROM),*" presentation from website zhangpatents, pp. 1–29.

Zhang, Ph.D., Guobiao, "*3D–ROM—A First Practical Step Towards 3D–IC*" Semiconductor International, Jul. 2000, from website zhangpatents, pp. 1–7.

(List continued on next page.)

*Primary Examiner*—David Lam
(74) *Attorney, Agent, or Firm*—Brinks Hofer Gilson & Lione

(57) ABSTRACT

The preferred embodiments described herein provide a three-dimensional memory cache system. In one preferred embodiment, a modular memory device removably connectable to a host device is provided. The modular memory device comprises a substrate, a cache memory array, a three-dimensional primary memory array, and a modular housing. The cache memory array and the three-dimensional primary memory array can be on the same or separate substrates in the modular housing. In another preferred embodiment, an integrated circuit is provided comprising a substrate, a cache memory array in the substrate, and a three-dimensional primary memory array above the substrate. Other preferred embodiments are provided, and each of the preferred embodiments can be used alone or in combination with one another.

29 Claims, 5 Drawing Sheets

U.S. PATENT DOCUMENTS

| | | |
|---|---|---|
| 5,283,759 A | 2/1994 | Smith |
| 5,285,323 A | 2/1994 | Hetherington et al. |
| 5,306,935 A | 4/1994 | Esquivel et al. |
| 5,427,979 A | 6/1995 | Chang |
| 5,441,907 A | 8/1995 | Sung et al. |
| 5,515,333 A | 5/1996 | Fujita et al. |
| 5,535,156 A | 7/1996 | Levy et al. |
| 5,553,019 A | 9/1996 | Sandvos et al. |
| 5,561,622 A | 10/1996 | Bertin et al. |
| 5,561,628 A | 10/1996 | Terada et al. |
| 5,568,361 A | 10/1996 | Ward et al. |
| 5,602,987 A | 2/1997 | Harari et al. |
| 5,640,343 A | 6/1997 | Gallagher et al. |
| 5,699,317 A | 12/1997 | Sartore et al. |
| 5,721,862 A | 2/1998 | Sartore et al. |
| 5,745,407 A | 4/1998 | Levy et al. |
| 5,812,418 A | 9/1998 | Lattimore et al. |
| 5,818,748 A | 10/1998 | Bertin et al. |
| 5,835,396 A | 11/1998 | Zhang |
| 5,856,221 A | 1/1999 | Clementi et al. |
| 5,877,975 A | 3/1999 | Jigour et al. |
| 5,889,694 A | 3/1999 | Shepard |
| 5,911,104 A | 6/1999 | Smayling et al. |
| 5,943,254 A | 8/1999 | Bakeman et al. |
| 6,034,882 A | 3/2000 | Johnson et al. |
| 6,104,628 A * | 8/2000 | Sugibayashi ............... 365/51 |
| 6,124,157 A | 9/2000 | Rahim |
| 6,131,140 A | 10/2000 | Rodgers et al. |
| 6,160,718 A | 12/2000 | Vakilian |
| 6,185,122 B1 | 2/2001 | Johnson et al. |
| 6,207,991 B1 | 3/2001 | Rahim |
| 6,208,545 B1 | 3/2001 | Leedy |
| 6,259,132 B1 | 7/2001 | Pio |
| 6,263,398 B1 | 7/2001 | Taylor et al. |
| 6,266,272 B1 | 7/2001 | Kirihata et al. |
| 6,378,118 B1 | 4/2002 | Sugibayashi |
| 6,420,215 B1 | 7/2002 | Knall et al. |
| 6,424,581 B1 | 7/2002 | Bosch et al. |
| 6,545,891 B1 * | 4/2003 | Tringali et al. ............ 365/51 |

OTHER PUBLICATIONS

"MultiMediaCard System Specification Version 2.2 Official Release," pp. 10, 12, and 14, Jan. 2000.

"A 10ns Read and Write Non–Volatile Memory Array Using a Magnetic Tunnel Junction and FET Switch in each Cell," Scheuerlein et al., ISSCC 2000/Session 7/TD: Emerging Memory & Device Technologies/Paper TA 7.2, 4 pages, Feb. 8, 2000.

"A 125mm$^2$/Gb NAND Flash Memory with 10MB/s Program Throughput," Nakamura et al., ISSCC 2002/Session 6/SRAM and Non–Volatile Memories/6.4, 10 pages (Dec. 4, 2002).

"Three–Dimensional Memory Array and Method of Fabrication," Johan Knall, U.S. App. Ser. No. 09/560,626 filed Apr. 28, 2002.

"Method for Deleting Stored Digital Data from Write–Once Memory Device," Christopher S. Moore, Derek J. Bosch, Daniel C. Steere, J. James Tringali, U.S. patent application Ser. No. 09/638,439 filed Aug. 14, 2002.

"Memory Device with Row and Column Decoder Circuits Arranged in a Checkerboard Pattern under a Plurality of Memory Arrays," Roy E. Scheuerlein, U.S. patent application Ser. No. 09/896,814 filed Jun. 29, 2001.

"Memory Devices and Methods for Use Therewith," Roger W. March, Christopher S. Moore, Daniel Brown, Thomas H. Lee, Mark G. Johnson, U.S. patent application Ser. No. 09/748,589 filed Dec. 22, 2000.

"Method for Reading Data in a Write–Once Memory Device Using a Write–Many File System," Christopher S. Moore, J. James Tringali, Roger W. March, James E. Schneider, Derek J. Bosch, Daniel C. Steere, U.S. patent application Ser. No. 09/878,138 filed Jun. 8, 2001.

"Method for Re–Directing Data Traffic in a Write–Once Memory," J. James Tringali, Christopher S. Moore, Roger W. March, James E. Schneider, Derek J. Bosch, Daniel C. Steere, U.S. patent application Ser. No. 09/877,691 filed Jun. 8, 2001.

"Memory Device and Method for Storing and Reading Data in a Write–Once Memory Array," Christopher S. Moore, James E. Schneider, J. James Tringali, Roger W. March, U.S. patent application Ser. No. 09/877,720 filed Jun. 8, 2001.

"Memory Device and Method for Storing and Reading a File System Structure in a Write–Once Memory Array," Christopher S. Moore, James E. Schneider, J. James Tringali, Roger W. March, U.S. patent application Ser. No. 09/877,719 filed Jun. 8, 2001.

"Method for Storing Digital Information in Write–Once Memory Array," David R. Friedman, Derek J. Bosch, Christopher S. Moore, Joseph J. Tringali, Michael A. Vyyoda, U.S. patent application Ser. No. 09/727,229 filed Nov. 30, 2000.

"Modular Memory Device," J. James Tringali, P. Michael Farmwald, Thomas H. Lee, Mark G. Johnson, Derek J. Bosch, U.S. patent application Ser. No. 09/638,334 filed Aug. 14, 2000.

"Low–Cost Three–Dimensional Memory Array," Mark G. Johnson, Thomas H. Lee, Vivek Subramanian, P. Michael Farmwald, N. Johan Knall, U.S. patent application Ser. No. 09/928,969 filed Aug. 13, 2001.

Douglas, John H., "*The Route To 3–D Chips*", High Technology, Sep. 1983, vol. 3, No. 9, pp. 55–59.

Edited by Cappelletti, Paulo et al., "*Flash Memories*", Kluwer Academic Publishers, 1999.

Kawashima, Shoichiro et al., "*A Charge–Transfer Amplifier and an Encoded–Bus Architecture for Low–Power SRAM's*", IEE Journal of Solid–State Circuits, vol. 33, No. 5, May 1998, pp. 793–799.

* cited by examiner

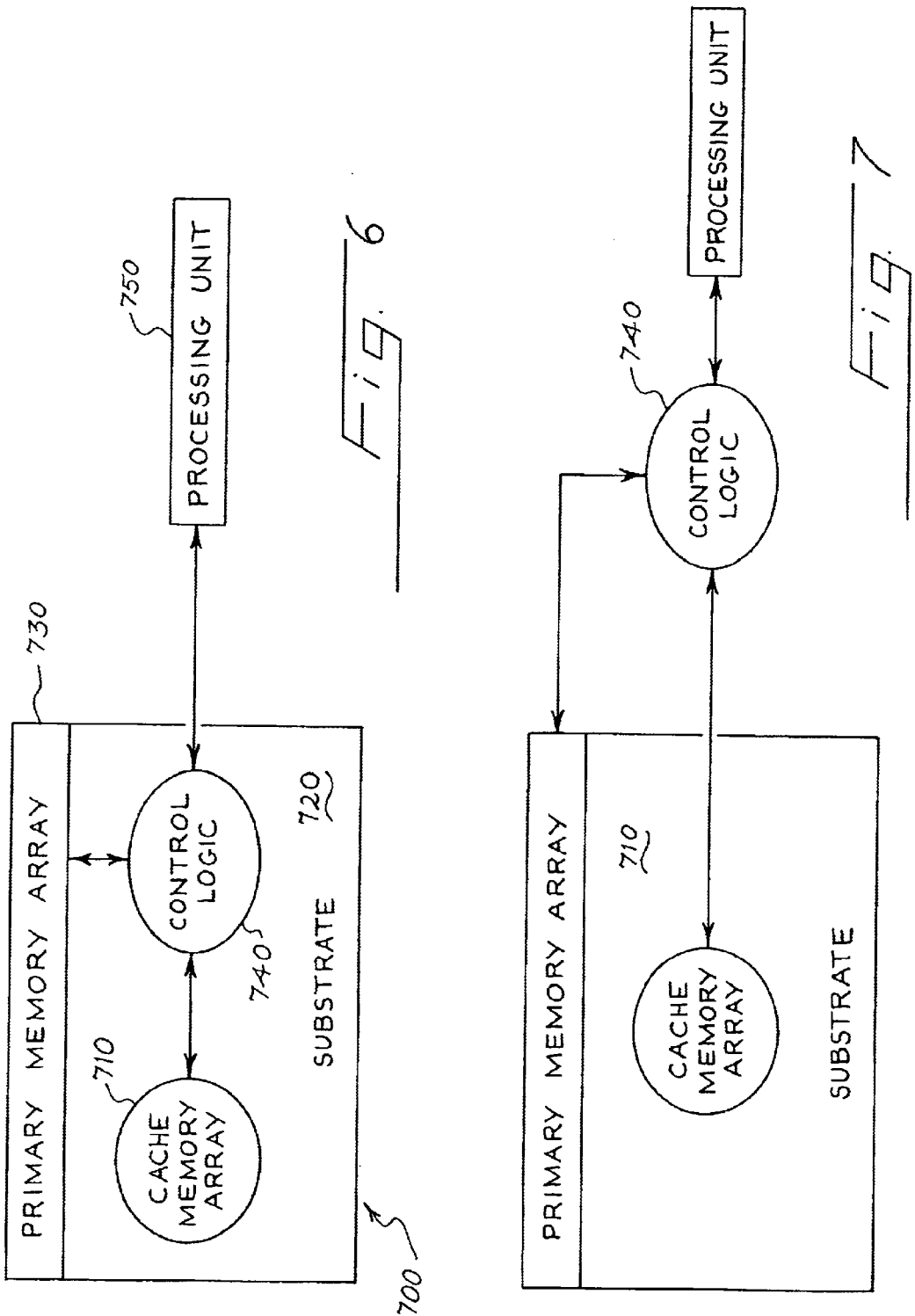

THREE-DIMENSIONAL MEMORY CACHE SYSTEM

RELATED APPLICATIONS

This application claims the benefit of U.S. Provisional Application No. 60/308,330 filed Jul. 26, 2001, which is incorporated by reference herein. Additionally, this application is a continuation-in-part of U.S. patent application Ser. No. 09/638,334, filed Aug. 14, 2000 now U.S. Pat. No. 6,545,891, which is also incorporated by reference herein.

BACKGROUND

A three-dimensional solid-state memory array is a relatively slow memory, but it is a far more economical means of storing data than other semiconductor memory types. The relatively slow read access time of three-dimensional memory arrays is not a drawback when the data read from the memory array is digital audio or digital images. However, when the data read from the memory array is code executed by a host device, a user can notice the delay because the clock speed of the host device is faster than what can typically be supported by a three-dimensional memory array. There is a need, therefore, for adapting three-dimensional memory arrays for use in faster environments.

Additionally, several caching topologies are known for use with two-dimensional memory arrays. In one caching topology, separate cache memory and two-dimensional primary memory chips are used. One disadvantage to this multi-chip arrangement is that chip-to-chip busses add cost and power to the system. In another caching topology, the cache memory and the two-dimensional primary memory are integrated in a single silicon chip in the same two-dimensional plane. Although this arrangement eliminates the inter-chip data transmission delay encountered with the multi-chip arrangement, area on the silicon chip is need for busses between the cache memory and the primary memory, thereby increasing die size and cost. Accordingly, there is also a need for a new caching topology that will overcome these disadvantages.

SUMMARY

The present invention is defined by the following claims, and nothing in this section should be taken as a limitation on those claims.

By way of introduction, the preferred embodiments described below provide a three-dimensional memory cache system. In one preferred embodiment, a modular memory device removably connectable to a host device is provided. The modular memory device comprises a substrate, a cache memory array, a three-dimensional primary memory array, and a modular housing. The cache memory array and the three-dimensional primary memory array can be on the same or separate substrates in the modular housing. In another preferred embodiment, an integrated circuit is provided comprising a substrate, a cache memory array in the substrate, and a three-dimensional primary memory array above the substrate. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 6 is a block diagram of an integrated circuit of a preferred embodiment.

FIG. 7 is a block diagram of an integrated circuit of another preferred embodiment.

DETAILED DESCRIPTION OF THE PRESENTLY PREFERRED EMBODIMENTS

Figure 1:
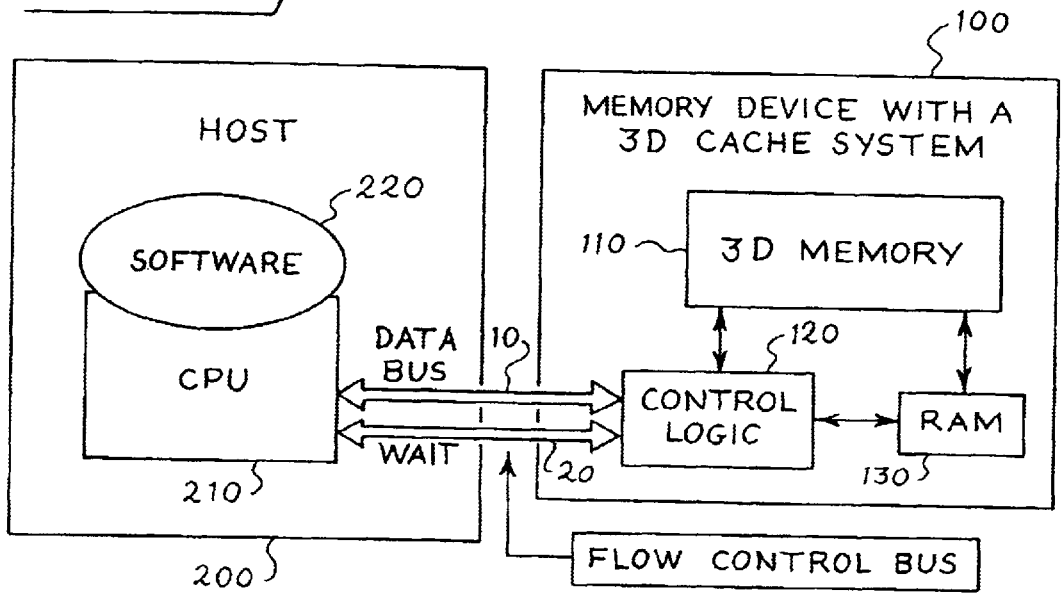
FIG. 1 is a block diagram of a memory device and host device of a preferred embodiment in which control logic in the memory device is responsible for flow control.

Turning now to the drawings, FIG. 1 is an illustration of one preferred embodiment. In this embodiment, a memory device with a three-dimensional cache system 100 is coupled with a host device 200. As used herein, the terms "connected to" and "coupled with" are intended broadly to cover elements that are connected to or coupled with one another either directly or indirectly through one or more intervening components. The three-dimensional cache system 100 comprises a solid-state three-dimensional memory array 110 (the "primary memory array") coupled with control logic 120 and a cache memory array 130 (here, RAM). It is important to note that control logic is not required to be in the memory device in every preferred embodiment and that control logic should not be read into the claims unless explicitly recited therein.

The three-dimensional primary memory array 110 preferably comprises a plurality of layers of memory cells stacked vertically above one another and above a substrate of an integrated circuit. Examples of such three-dimensional memory arrays can be found in U.S. Pat. No. 6,034,882 to Johnson et al. and U.S. patent application Ser. No. 09/560,626, both of which are assigned to the assignee of the present invention and are hereby incorporated by reference. It should be noted that some prior memory arrays have cells that protrude either upwardly or downwardly. While these cells have, in the past, been referred to as a "three dimensional memory cell," these memory cells are arrayed in a conventional two-dimensional array and are not stacked vertically above one another and above a single substrate of an integrated circuit. Accordingly, an array of such cells is not a "three-dimensional memory array," as that term is used herein. Further, individual integrated circuits each containing a separate two-dimensional memory array can be stacked and secured together. However, the overall three-dimensional structure is not a monolithic "three-dimensional memory array" because the memory cells of the stack are not stacked above a single substrate and the memory cells are not stacked vertically above one another (because there is an interposing substrate between each layer).

In the embodiment shown in FIG. 1, the cache memory array 130 takes the form of RAM. In addition to RAM (e.g., SRAM or DRAM), other suitable memory devices can be used, such as but not limited to NOR Flash or EPROM/EEPROM. Accordingly, the cache memory can be either a non-volatile or volatile memory. However, the cache memory array 130 preferably comprises volatile memory cells, and the three-dimensional primary memory array preferably comprises non-volatile memory cells. Also, it is preferred that the three-dimensional primary memory array have a greater storage capacity than the cache memory array and that the memory cells of the three-dimensional primary memory array have a slower access time than memory cells of the cache memory array. As will be clear from the following discussion, a cache memory array is used to temporarily store (1) data that is later to be stored in the three-dimensional primary memory array and/or (2) data that was previously stored in the three-dimensional primary memory array.

The host device 200 comprises a processor (here, a CPU 210) running software 220. Any suitable host device can be used. For example, the host device 200 can be a cell phone, and the memory array 110 can store a speech recognition program or a program used to play audio on the cell phone. As another example, the host device 200 can be a set-top box, and the memory array 100 can store an application that allows the set-top box to record television shows featuring designated actors. The data stored in the memory array 110 can be pre-authored data that is delivered with the host device to the end-user, can be data downloaded to the host device, can be data created and stored with the host device 200, or can be any combination of the foregoing. Additionally, the "code" stored in these devices can be the software upon which the entire system relies, like the operating system of a PC.

A three-dimensional solid-state memory has several advantages over disk drives. It has no moving parts, consumes less power, is more compact, and can allow lower-cost system designs. Such memories are particularly well suited for use in cost- and size-sensitive consumer electronic devices but need to be adapted to meet the speed demands of the code and applications resident therein. The preferred embodiments described herein can be used to address these demands. Specifically, fast RAM memory 130 is used in conjunction with the control logic circuitry 120 to increase the performance of the slower, non-volatile three-dimensional memory 110 by regulating the flow of data between the RAM 130 and the host device 200. The result is an extremely economical way of storing code/applications in a semiconductor device while still meeting performance requirements of the host device. As described below, the control logic 120 manages the caching of data stored in the relatively-slow three-dimensional memory 110 to the relatively-faster RAM 130.

As shown in FIG. 1, the control logic 120 is coupled to the CPU 210 of the host device 200 via a bus. While two lines are shown connecting the control logic 120 and the CPU 210 (the data bus 10 and the flow control bus 20), these two lines are preferably part of a single physical bus (i.e., the flow control bus is a copper wire on the bus that contains the data bus). Alternatively, multiple physical busses can be used. In operation, the CPU 210 of the host device 200 requests data from the memory device 100, and the control logic 120 determines if the requested data is stored in RAM 130. If the requested data is stored in RAM 130, the control logic 120 sends the data from RAM 130 to the CPU 210 via the data bus 10. If the requested data is not stored in RAM 130, the control logic 120 sends a "wait" signal to the CPU 210 on the flow control bus 20. The control logic 120 then transfers the requested data from the three-dimensional memory 10 to the RAM 130. During the time the "wait" signal is asserted, the CPU 210 does not perform any operations, and no data is transferred over the data bus 10 to the CPU 210. When the data is transferred from the three-dimensional memory array 110 to the RAM 130, the control logic 120 removes the "wait" signal from the flow control bus and sends the requested data from the RAM 130 to the CPU 210 via the data bus 10.

Figure 2:
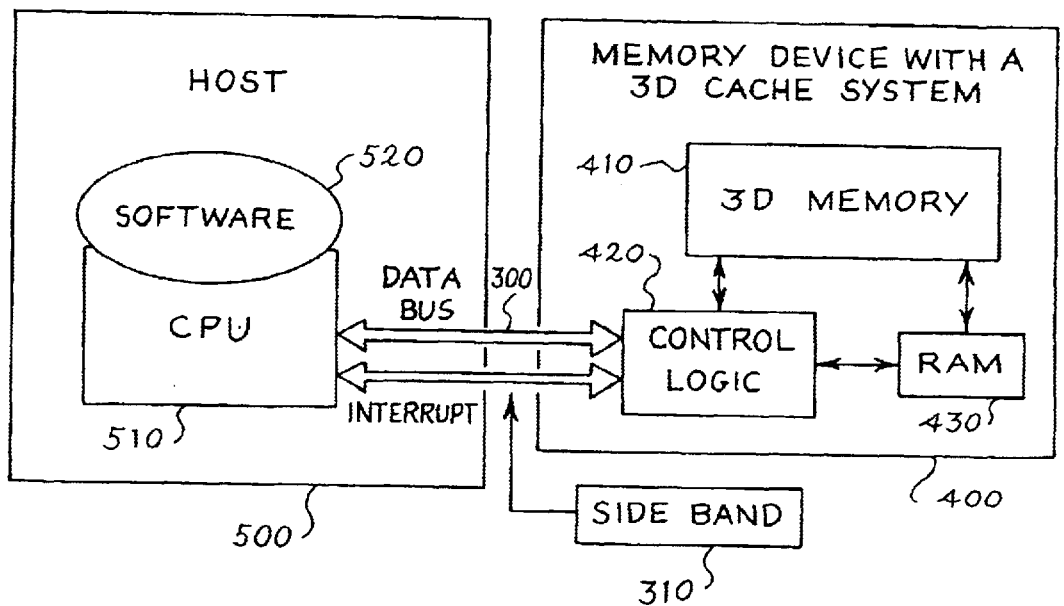
FIG. 2 is a block diagram of a memory device and host device of a preferred embodiment in which software in the host device is responsible for flow control.

In the embodiment discussed above, the control logic 120 was responsible for flow control by using the flow control bus to cause the CPU 210 to "wait" while data stored in the three-dimensional memory 110 was cached in RAM 130. In an alternate embodiment, software in the host device can be responsible for flow control. This alternate embodiment may be preferred when the host device does not accept a flow control bus as input and, accordingly, the control logic cannot send a "wait" signal to the CPU. This alternate embodiment will now be illustrated in conjunction with FIG. 2. As shown in FIG. 2, a memory device with a three-dimensional cache system 400 is coupled with a host device 500. While two lines are shown connecting the memory device 400 and the host device 500 (the data bus 300 and side band 310), these two lines are preferably part of a single physical bus. The three-dimensional cache system 400 comprises a solid-state three-dimensional memory array 410 coupled with control logic 420 and a cache memory 430 (here, RAM). Preferably, the control logic 420 in this embodiment comprises a DMA controller. The host device 500 comprises a processor (here, a CPU 510) and software 520. In this embodiment, the software 520 knows what data is stored in the RAM 430.

In operation, if the software 520 knows that the data it needs is stored in RAM 430, it sends a request for that data to the control logic 420, which retrieves the data from the RAM 430 and sends it to the CPU 510 via the data bus 300. However, if the software 520 knows that the data it needs is not stored in the RAM 430, it instructs the control logic 420 to transfer the needed data from the three-dimensional memory 410 to the RAM 430. While this transfer is taking place, the software 520 performs some other function, such as requesting additional data that is stored in the RAM 430. The control logic 420 sends the additional data from the RAM 430 to the CPU 510 via the data bus 300. Accordingly, additional data is transferred on the data bus 300 while the caching takes place, unlike the embodiment described above in which no data is transferred on the data bus while the "wait" signal is provided to the CPU. When the data is cached in the RAM 430, the control logic 420 sends an interrupt signal in the sideband 310 of the data bus 300. Data can be flowing on the data bus 300 when the interrupt signal is sent in the sideband 310. The CPU 510 processes the interrupt command and then the software 530 sends a request for the newly-cached data to the control logic 420, which retrieves the data from the RAM 430 and sends it to the CPU 510 via the data bus 300.

In another preferred embodiment, instead of using bus based flow control, the control logic interrupts software access to the cache memory by presenting an alternate set of instructions to the host software in lieu of the data residing in the cache memory. In this manner, accesses to the cache memory, which needs to be reloaded from the three-dimensional memory array (the backing store), would be diverted. This diversion allows the control logic sole access to the cache memory for transferring the next block of data from the backing store to the appropriate area in the cache memory. Once the control logic has completed its transfer, it redirects the host software back to the proper area for continuation in the now updated cache memory.

Figure 3:
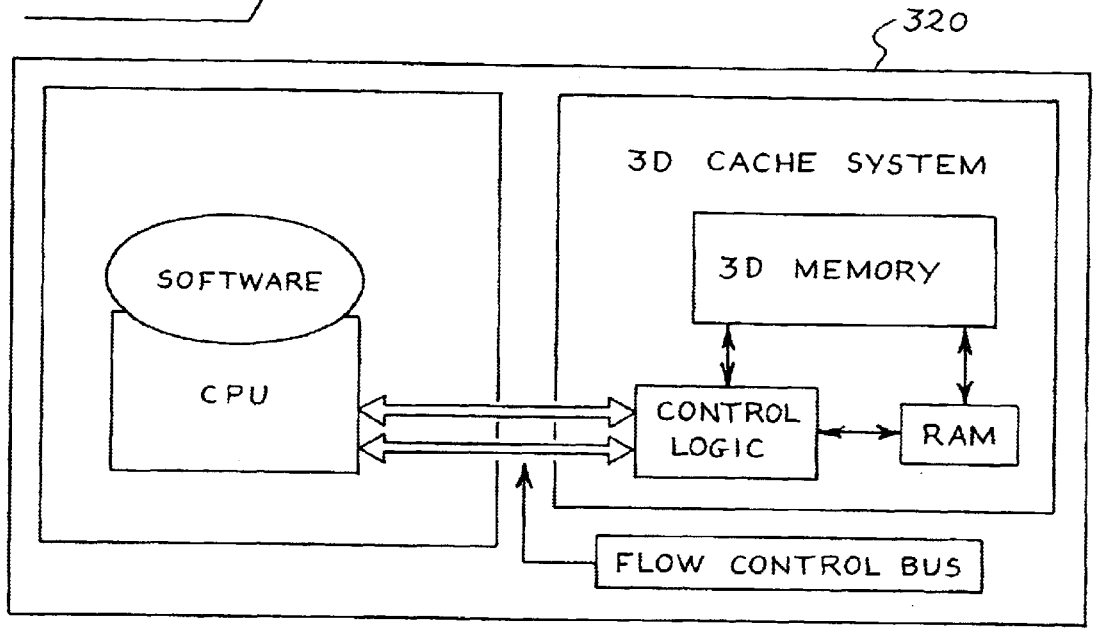
FIG. 3 is an illustration of a preferred embodiment in which a three-dimensional cache system is part of a device that comprises a CPU and software.
Figure 4:
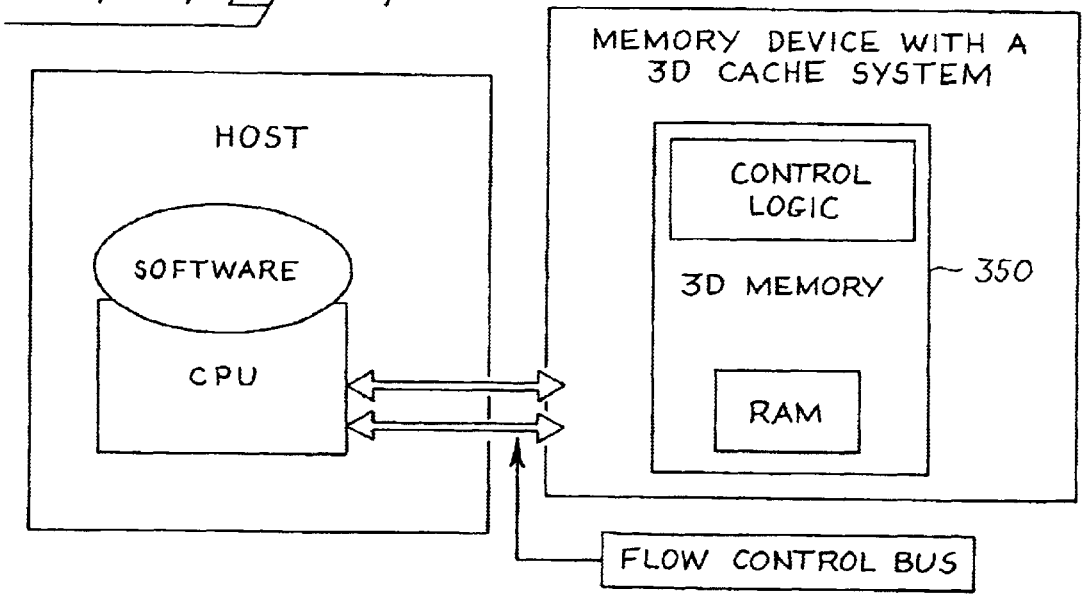
FIG. 4 is a block diagram of a preferred embodiment in which RAM memory and caching control circuitry are part of a single-chip solution.

There are several alternatives that can be used with these preferred embodiments. For example, in the embodiments discussed above, the three-dimensional cache system was part of a modular memory device comprising a modular housing enclosing a substrate, cache memory array, and three-dimensional primary memory array, which was coupled with a host device comprising a CPU and software. For example, the host device can be a cell phone, and the memory device can be a handheld, modular memory device (such as a memory card or stick) that is removably connectable to the cell phone. In an alternate embodiment, shown in FIG. 3, the three-dimensional cache system is part of a device 320 that comprises the CPU and software. For example, the three-dimensional cache system, CPU, and software can be part of a set-top box. Additionally, while the RAM memory and caching control circuitry was shown as part of a multiple-chip solution in FIGS. 1–3, the RAM memory and caching control circuitry can be part of a single-chip solution 350, as shown in FIG. 4. In this way, all parts can exist on one single die. In other words, instead of being on two different substrates, the cache memory array and the three-dimensional non-volatile memory array can be integrated in the same substrate. In another alternate embodiment, instead of being in the memory device 100, the control logic 120 can be located external to the memory device 100, such as in the host device 200.

Suitable types of three-dimensional memory arrays are described in the following patent documents, each of which is hereby incorporated by reference: U.S. Pat. Nos. 6,034,882 and 5,835,396 and U.S. patent applications Ser. Nos. 09/638,428; 09/638,334; 09/727,229; 09/638,439; 09/638,427; 09/638,334; 09/560,626; and 09/662,953. While write-many memory cells can be used in the three-dimensional memory array 110, it is preferred that the memory cells of the three-dimensional memory array be write-once memory cells. In a write-once memory cell, an original, un-programmed digital state of the memory cell (e.g., the Logic 1 state) cannot be restored once switched to a programmed digital state (e.g., the Logic 0 state). The memory cells can be made from any suitable material. The memory cells are preferably made from a semiconductor material; however, other materials such as phase-change materials and amorphous solids as well as those used with MRAM and organic passive element arrays can be used.

Figure 5A:
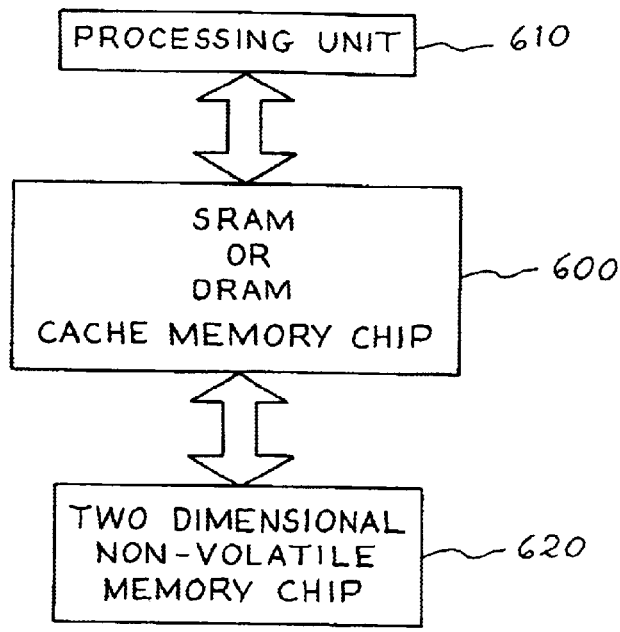
FIG. 5A is a block diagram of a prior art multi-chip caching topology.
Figure 5B:
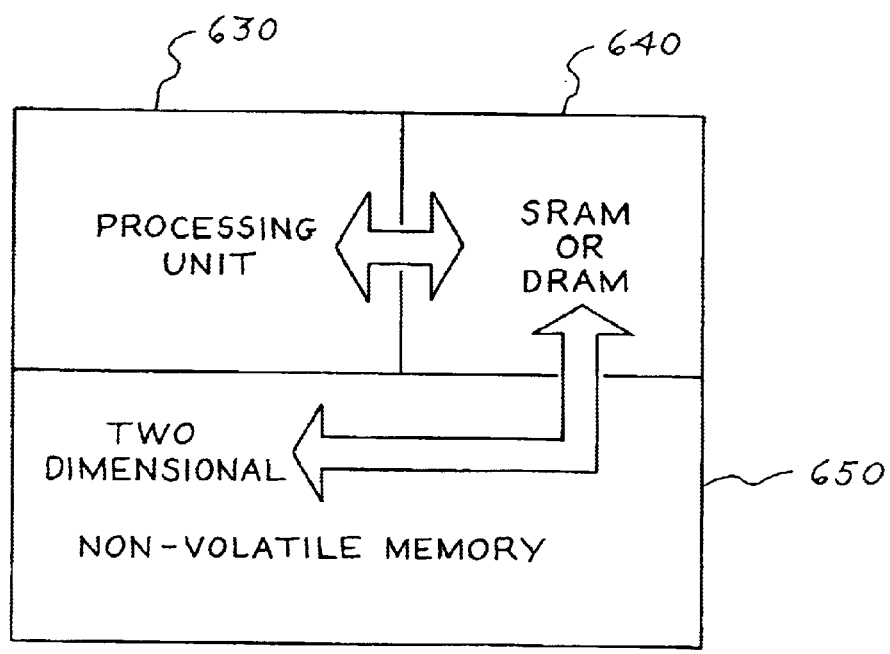
FIG. 5B is a block diagram of a prior art systems-on-chips (SoC) caching topology.

As mentioned above, the cache memory array and the three-dimensional non-volatile memory array can be two different chips or part of a single-chip solution. The advantages of integrating the cache memory array and the three-dimensional non-volatile memory array in a single chip can be appreciated when viewed against the prior approaches to caching using a two-dimensional memory array. In one prior approach, a cache memory chip 600 (e.g., an SRAM or DRAM memory chip) is placed between a processing unit 610 and a two-dimensional non-volatile memory chip 620 (e.g., a Flash memory chip) (see FIG. 5A). One disadvantage to this multi-chip arrangement is that the chip-to-chip busses between the processing unit 610, cache memory chip 600, and two-dimensional non-volatile memory chip 620 add cost and power to the system. As an alternative to the multi-chip arrangement, a systems-on-chips (SoC) arrangement has been used in which the processing unit 630, cache memory 640, and two-dimensional non-volatile memory 650 are integrated in a single silicon chip (see FIG. 5B). While the SoC approach eliminates the inter-chip data transmission delay encountered with the multi-chip arrangement, there are other disadvantages associated with the SoC approach. First, because area on the silicon chip is used for busses between the cache memory 640 and the non-volatile memory 650, a larger die must be used, thereby increasing die cost. Additionally, the relatively long busses involved result in relatively large chip power due to driver size. Further, the limited available silicon space requires trading off one memory type for another, limiting the size and complexity of the circuits that can be put on the chip. Also, because the same silicon processing is usually applied to both the cache memory 640 and the non-volatile memory 650, the individual performance and manufacturability of each type of memory can be compromised.

FIG. 6 is a diagram of a caching topology of a preferred embodiment that overcomes the disadvantages described above. In this preferred embodiment, an integrated circuit 700 is provided in which a volatile memory array (the "cache memory array") 710 is built in a silicon substrate surface 720 and a non-volatile memory array (the "primary memory array") 730 is built in one or more layers above the silicon substrate surface 720 and the volatile memory array 710. The non-volatile memory array 730 is a three-dimensional memory array (i.e., its memory cells are arranged in a plurality of layers stacked vertically above one another and above the substrate 720). While the volatile memory array 710 can be located in any suitable location in the substrate 720, the volatile memory array 710 is preferably distributed below the three-dimensional non-volatile memory array 730 in the open area in the substrate 720 defined by support circuitry in the substrate 720 for the three-dimensional primary memory array 730, as described in U.S. patent application Ser. No. 10/185,588; filed on the same day as the present application), which is assigned to the assignee of the present invention and is hereby incorporated by reference. That application also describes different memories and control logic that can be distributed in the open area in the substrate 720.

It is preferred that the memory cells in the cache memory array 710 have a relatively faster access time (i.e., write and/or read time) than the memory cells in the primary memory array 730 and that the primary memory array 730 have a greater storage capacity than the cache memory array 710. It should be noted that the non-volatile memory array 730 is called the "primary" memory array because of its larger size with respect to the cache memory array 710. The primary memory array 730 is not necessarily the largest memory storage unit in the system. For example, as will be described in more detail below, a disk drive with a much larger storage capacity than the primary memory array 730 can be used in conjunction with the integrated circuit 700.

There are several advantages associated with a caching topology using the integrated circuit of this preferred embodiment as compared to prior approaches using a two-dimensional memory array. Like the SoC approach described above, this preferred embodiment eliminates the problems associated with using two different chips to perform caching of data. Integrating multiple functional blocks onto one chip saves system power by eliminating the need for drivers and busses to pass signals between individual chips. Further, integrating the high bandwidth connection between the two memories in a single piece of silicon saves cost and power. There are also several advantages to this preferred embodiment as compared to the SoC approach. First, die cost is reduced because the non-volatile memory array sits above the cache memory array and, hence, saves area. Also, because most of the three-dimensional non-volatile memory process is in separate layers, the cost impact is minimized because the chip size is about half that of a two-dimensional memory array. Second, the bus structure between the cache memory array and the primary memory array can be wide and short because of the relative proximity of the memory arrays. This saves cost (because of the area savings) and power (because of the small drivers needed for short distances). In contrast, the SoC two-dimensional integrated systems requires longer busses and larger die sizes. Further, chip power is reduced with this preferred embodiment because of the higher degree of integration. Finally, with this preferred embodiment, the cells of both memory arrays can be pitch-matched and stacked directly above one another, allowing common sensing and decoding circuitry to be used for both types of cells. This saves cost (because of the area savings) and power (because half as many driver circuits are used).

Any suitable form of caching can be implemented with the control logic 740 of the system. The control logic 740 can be formed in the substrate 710 of the integrated circuit 700 (see FIG. 7) or can be separate from the integrated circuit 700 (see FIG. 8). Any of the flow control embodiments described above can be used. For example, the control logic 740 can transfer subsets of data stored in the primary memory array 730 to the cache memory array 720 to allow faster access to the data. This emulates a fast memory array with a relatively slow three-dimensional memory array. In operation, the control logic 740 transfers into the cache memory array 720 a subset of data stored in the primary memory array 730 before the data is requested by a processing unit 750. By reading from the relatively faster cache memory array 720 instead of from the primary memory array 730, the processing unit 750 spends less time reading stored data. Additionally, this preferred embodiment can be used to provide a higher "virtual density" SRAM array in applications such as 3G cellular phones.

The control logic 740 can also be used to control the transfer of data from the cache memory array 720 to the primary memory array 730. To allow faster writes of data, the control logic 740 temporarily stores data sent by the processing unit 750 in the cache memory array 720 and later transfers the data from the cache memory array 720 to the primary memory array 730. Because the cache memory array 720 has a faster write time than the primary memory array 730, the processing unit 750 does not need to wait as long to store data as it would if the data were stored directly in the primary memory array 730.

Figure 8:
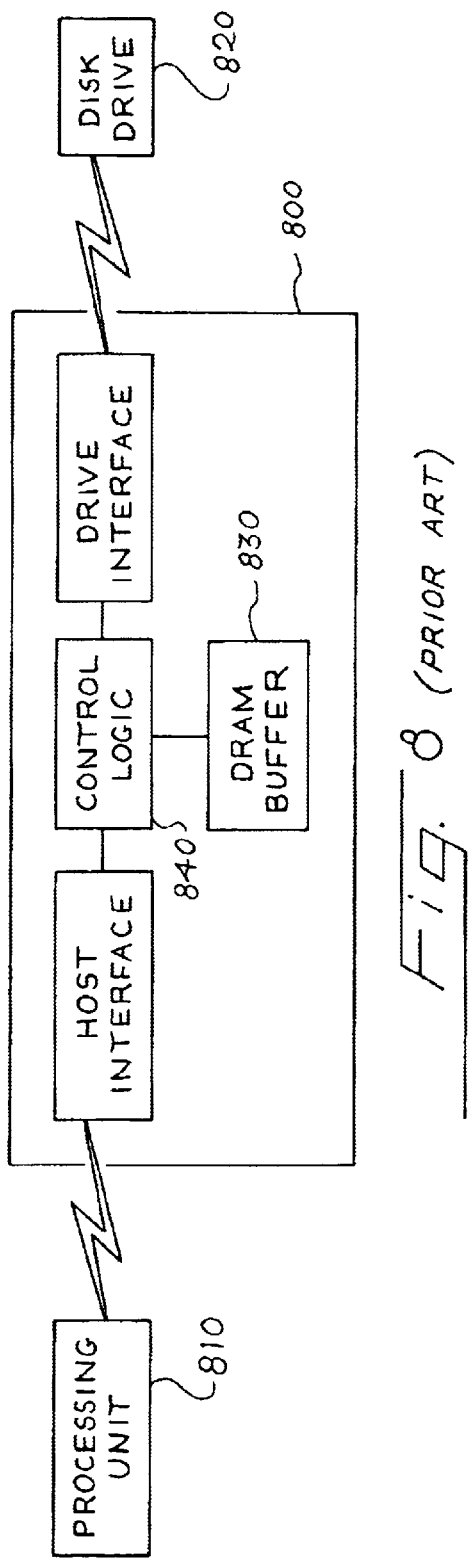
FIG. 8 is a block diagram of a prior art disk drive controller.

In another application of this preferred embodiment, the integrated circuit is part of a disk drive controller. The advantages associated with this application can be appreciated when viewed against conventional disk drive controllers. FIG. 8 is a diagram of a prior art disk drive controller 800 coupled between a processing unit 810 and a disk drive 820. Because of the very slow speed of the mechanical disk drive 820, a cache memory array (here, a DRAM buffer) 830 is used to increase the speed of the write operation. That is, instead of waiting for the control logic 840 to store data sent from the processing unit 810 in the relatively slower disk drive 820, the control logic 840 stores the data in the relatively faster DRAM buffer 830. The control logic 840 later transfers the data from the DRAM buffer 830 to the disk drive 820. The time between committing the data from the DRAM buffer 830 to disk drive 820 is long enough that a power outage or other form of unanticipated malady can cause data to become invalid in the RAM buffer 820 before transfer of the data to the disk drive 820 is complete. To maintain data integrity, the processing unit 810 waits for positive feedback from the disk drive 820 before it continues processing. Therefore, even with the use of the DRAM buffer 830, there is a write delay because the processing unit 810 does not complete its transaction until there has been a confirmed write to the disk drive 830. Additionally, because DRAM needs refreshing, a large amount of data to be stored in the disk drive 830 requires a relatively large amount of power to refresh the DRAM buffer 830.

Figure 9:
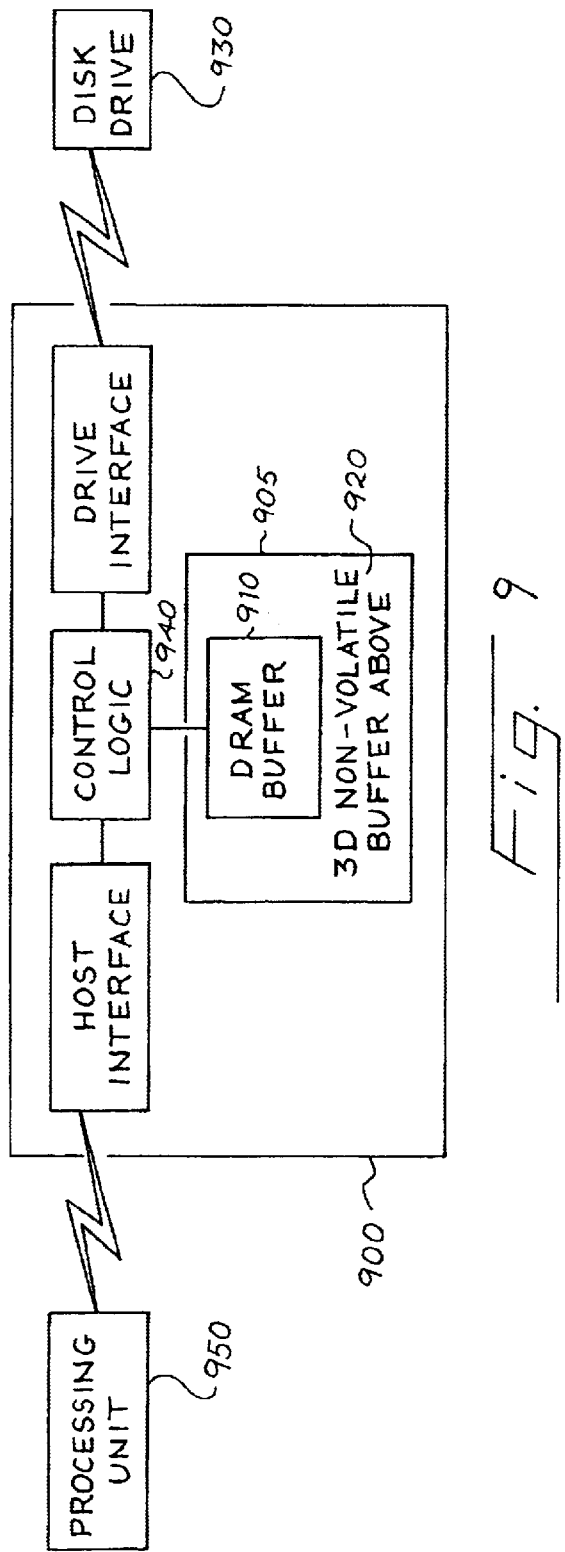
FIG. 9 is a block diagram of a disk drive controller of a preferred embodiment.

To avoid the large time penalty in waiting for the drive interface to be ready to receive data, a disk drive controller 900 can be used having an integrated circuit 905 with a cache memory array (e.g., a DRAM buffer) 910 built on the silicon substrate surface and a three-dimensional non-volatile memory array 920 built above the silicon substrate (see FIG. 9). While DRAM is used in this example, it should be noted that any high speed volatile memory, such as SRAM, can be used in the cache memory array 910. In this embodiment, the monolithic DRAM buffer 910 and non-volatile memory array 920 create a two level cache to improve host-write-to-disk performance. The first level of cache is the high speed volatile DRAM buffer 910, and the second level is the lower speed but non-volatile backing store 920. The third level of memory is the ultra slow mechanical disk drive 930. With this preferred embodiment, system write speed is gated by the speed of the level two (non-volatile 920) memory and not the very slow level three (disk drive 930) memory. In operation, instead of transferring data from the DRAM buffer 910 to the disk drive 930 as in the prior art, the control logic 940 transfers the data from the DRAM buffer 910 to the non-volatile memory array 920 above the substrate. Since writes to the non-volatile memory array 920 are faster than to the disk drive 930, the processing unit 950 receives a faster write confirmation as compared to the prior approach. The increased capacity of the combined DRAM/non-volatile memory allows for larger and less frequent transfers to the disk drive 930, thereby improving system performance.

The volatile memory cells in the cache memory array can take any suitable form, including, but not limited to, SRAM cells (for a very fast memory) and DRAM cells (for a dense and relatively fast memory). Additionally, any suitable write-once or re-writable non-volatile memory cell that can be formed in vertically-stacked transistor structures above the silicon substrate can be used in the primary memory array. Suitable non-volatile memory cells include, but are not limited to, the Flash cells, junction anti-fuse memory cells, and pillar anti-fuse memory cells described in the patent documents incorporated by reference earlier in this detailed description, as well as EEPROM three-dimensional memory cells using SONOS or floating-gate cells, as described in U.S. patent application Ser. No. 09/927,648, filed Aug. 13, 2001, which is assigned to the assignee of the present invention and is hereby incorporated by reference.

In the preferred embodiments described above, a single type of memory cell was used in the cache memory and a different single type of memory cell was used in the three-dimensional memory array. It is important to note that there is no limit to the number of memory types that can be used in each memory array, and that a plurality of memory types can be used per die to resolve different memory requirements. For example, both field-programmable write-once and field-programmable re-writable memory cells can be used in the three-dimensional memory array, as described in U.S. patent application Ser. No. 10/184578, filed on the same day as the present application), which is assigned to the assignee of the present invention and is hereby incorporated by reference. As another example, one die can contain two completely separate 3-D write-once cells, one cell programmed during manufacturing for register settings used by a controller and another updateable in the field to store data, such as a digital media file (e.g., pictures, songs). Additionally, the same die can contain multiple re-writeable memory cells (e.g., Flash, 3-D memory, DRAM, SRAM) to store file system structures (such as a FAT table, root directory, or sub-directory) or data with different speed or access time requirements (e.g., the write and/or read times can vary). As data can be allocated for different performance requirements, a plurality of re-writeable cells can be used for different data types. Moreover, memory cells can be assigned for different levels of cache hierarchies (e.g., L1, L2, L3 cache), as described above.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A modular memory device removably connectable to a host device, the modular memory device comprising:
    a substrate;
    a cache memory array;
    a three-dimensional primary memory array comprising a plurality of layers of memory cells stacked vertically above one another and above the substrate; and
    a modular housing enclosing the substrate, cache memory array, and three-dimensional primary memory array.

2. The invention of claim 1, wherein the cache memory array comprises a plurality of volatile memory cells and the three-dimensional primary memory array comprises a plurality of non-volatile memory cells, wherein the three-dimensional primary memory array has a greater storage capacity than the cache memory array, and wherein memory cells of the three-dimensional primary memory array have a slower access time than memory cells of the cache memory array.

3. The invention of claim 1, wherein the cache memory array is formed in the substrate under the three-dimensional primary memory array.

4. The invention of claim 1 further comprising a second substrate enclosed by the modular housing, wherein the cache memory array is formed in the second substrate.

5. The invention of claim 1 further comprising control logic coupled with the three-dimensional primary memory array and the cache memory array.

6. The invention of claim 5, wherein the control logic is responsible for flow control.

7. The invention of claim 5, wherein the control logic is coupled with a processing unit in a host device via a flow control bus, and wherein the control logic is operative to send a wait signal to the processing unit via the flow control bus if data requested by the processing unit is not stored in the cache memory array.

8. The invention of claim 5, wherein the control logic is coupled with a processing unit in a host device, and wherein the processing unit is operative to perform a task while waiting for data requested by the processing unit to be transferred from the three-dimensional primary memory array to the cache memory array.

9. The invention of claim 8, wherein the control logic is operative to send an interrupt signal in a sideband of a data bus coupling the control logic and the processing unit after the data requested by the processing unit is transferred from the three-dimensional primary memory array to the cache memory array.

10. The invention of claim 5, wherein the control logic is operative to send a processing unit in a host device a set of instructions in lieu of data requested by the processing unit if the data requested by the processing unit is not stored in the cache memory array.

11. The invention of claim 5, wherein the control logic comprises a DMA controller.

12. The invention of claim 1, wherein a host device connected to the modular memory device is responsible for flow control between the three-dimensional primary memory array and the cache memory array.

13. The invention of claim 1, wherein the three-dimensional primary memory array comprises a plurality of write-once memory cells.

14. The invention of claim 1, wherein the three-dimensional primary memory array comprises a plurality of write-many memory cells.

15. The invention of claim 1, wherein the three-dimensional primary memory array comprises a semiconductor memory array.

16. An integrated circuit comprising:
    a substrate;
    a cache memory array formed in the substrate; and
    a three-dimensional primary memory array comprising a plurality of layers of memory cells stacked vertically above one another and above the substrate.

17. The invention of claim 16, wherein the integrated circuit further comprises control logic operative to transfer data between the cache memory array and the three-dimensional primary memory array.

18. The invention of claim 16, wherein the cache memory array and the three-dimensional primary memory array are in communication with control logic external to the integrated circuit, the control logic operative to transfer data between the cache memory array and the three-dimensional primary memory array.

19. The invention of claim 17 or 18, wherein the control logic is in communication with a processing unit, and wherein the control logic is operative to store data received from the processing unit in the cache memory array and then transfer the data from the cache memory array to the three-dimensional primary memory array.

20. The invention of claim 17 or 18, wherein the control logic is in communication with a processing unit, and wherein the control logic is operative to transfer data stored in the three-dimensional primary memory array to the cache memory array and then transfer the data from the cache memory array to the processing unit.

21. The invention of claim 16, wherein the cache memory array comprises a plurality of volatile memory cells and the three-dimensional primary memory array comprises a plurality of non-volatile memory cells, wherein the three-dimensional primary memory array has a greater storage capacity than the cache memory array, and wherein memory cells of the three-dimensional primary memory array have a slower access time than memory cells of the cache memory array.

22. The invention of claim 16, wherein the cache memory array comprises SRAM memory cells.

23. The invention of claim 16, wherein the cache memory array comprises DRAM memory cells.

24. The invention of claim 16, wherein the three-dimensional primary memory array comprises anti-fuse memory cells.

25. The invention of claim 16, wherein the three-dimensional primary memory array comprises EEPROM memory cells.

26. The invention of claim 16, wherein at least some memory cells of the cache memory array are pitch-matched to at least some memory cells of the three-dimensional primary memory array.

27. The invention of claim 16, wherein the integrated circuit is part of a disk drive controller.

28. The invention of claim 16, wherein the integrated circuit is part of a modular memory device that is removably connectable to a host device.

29. The invention of claim 16 further comprising support circuitry for the three-dimensional primary memory array, the support circuitry formed in the substrate at least partially under the three-dimensional primary memory array, wherein the support circuitry defines open area in the substrate under the three-dimensional primary memory array, and wherein the cache memory array is formed at least partially in the open area in the substrate under the three-dimensional primary memory array.

* * * * *